United States Patent
Miyasaka

(10) Patent No.: US 9,660,176 B2
(45) Date of Patent: May 23, 2017

(54) METHOD OF MANUFACTURING ELECTRONIC DEVICE, ELECTRONIC APPARATUS, AND MOBILE APPARATUS

(71) Applicant: Seiko Epson Corporation, Tokyo (JP)

(72) Inventor: Hideo Miyasaka, Okaya (JP)

(73) Assignee: Seiko Epson Corporation (JP)

( * ) Notice: Subject to any disclaimer, the term of this patent is extended or adjusted under 35 U.S.C. 154(b) by 582 days.

(21) Appl. No.: 14/031,663

(22) Filed: Sep. 19, 2013

(65) Prior Publication Data

US 2014/0084752 A1 Mar. 27, 2014

(30) Foreign Application Priority Data

Sep. 26, 2012 (JP) ................. 2012-211896

(51) Int. Cl.
| | |
|---|---|
| *B23K 31/02* | (2006.01) |
| *H01L 41/23* | (2013.01) |
| *H03H 9/10* | (2006.01) |
| *B23K 1/00* | (2006.01) |
| *B23K 1/005* | (2006.01) |
| *G01C 19/5628* | (2012.01) |
| *B23K 101/36* | (2006.01) |

(52) U.S. Cl.
CPC .............. *H01L 41/23* (2013.01); *B23K 1/005* (2013.01); *B23K 1/0016* (2013.01); *G01C 19/5628* (2013.01); *H03H 9/10* (2013.01); *H03H 9/1021* (2013.01); *H03H 9/1057* (2013.01); *H03H 9/1071* (2013.01); *B23K 2201/36* (2013.01); *H01L 2924/16195* (2013.01); *Y10T 29/42* (2015.01)

(58) Field of Classification Search
None
See application file for complete search history.

(56) References Cited

U.S. PATENT DOCUMENTS

| | | | | |
|---|---|---|---|---|
| 3,217,088 A | * | 11/1965 | Steierman | C03B 23/20 148/DIG. 71 |
| 3,268,779 A | * | 8/1966 | Roach | H01L 23/02 174/564 |
| 4,110,655 A | * | 8/1978 | Hata | H03H 9/1021 310/344 |
| 4,266,156 A | * | 5/1981 | Kizaki | G04F 5/063 310/317 |
| 4,328,921 A | * | 5/1982 | Liang | B23K 35/0222 228/222 |
| 4,372,037 A | * | 2/1983 | Scapple | H05K 3/341 174/561 |

(Continued)

FOREIGN PATENT DOCUMENTS

| | | | | |
|---|---|---|---|---|
| CN | 102130661 A | * | 7/2011 | |
| DE | EP 0795891 A2 | * | 9/1997 | B23K 1/008 |

(Continued)

*Primary Examiner* — Kiley Stoner
(74) *Attorney, Agent, or Firm* — Harness, Dickey & Pierce, P.L.C.

(57) ABSTRACT

A method of manufacturing an electronic device including an electronic element, a base substrate, and a lid member, includes joining the lid member to the sealing part by application of an energy beam so that a plate thickness of the lid member may be larger in a part joined to the sealing part than in a part located inside of the part in a plan view along the thickness direction.

5 Claims, 6 Drawing Sheets

(56) References Cited

U.S. PATENT DOCUMENTS

| | | | |
|---|---|---|---|
| 4,746,583 A * | 5/1988 | Falanga | H01L 23/04 174/554 |
| 4,750,665 A * | 6/1988 | Falanga | H01L 21/67126 228/123.1 |
| 4,769,272 A * | 9/1988 | Byrne | B23K 1/14 174/538 |
| 6,437,412 B1 * | 8/2002 | Higuchi | H03H 9/1071 257/416 |
| 7,182,240 B2 * | 2/2007 | Yoshino | H01L 21/50 228/124.6 |
| 7,351,641 B2 * | 4/2008 | Haba | B81B 7/007 257/704 |
| 2002/0014121 A1 | 2/2002 | Urabe | H03H 9/1071 73/599 |
| 2002/0036546 A1* | 3/2002 | Hatanaka | H03B 5/32 331/68 |
| 2002/0088841 A1* | 7/2002 | Li | B23K 1/0008 228/245 |
| 2002/0125041 A1* | 9/2002 | Yamamoto | H01L 23/498 174/256 |
| 2003/0222061 A1* | 12/2003 | Langer | H01L 51/5246 219/121.66 |
| 2004/0012302 A1* | 1/2004 | Ikeda | H03H 3/08 310/313 D |
| 2004/0017004 A1* | 1/2004 | Kasai | B32B 18/00 257/704 |
| 2004/0094320 A1* | 5/2004 | Goto | H01L 23/04 174/50.51 |
| 2004/0113215 A1* | 6/2004 | Shimada | G01H 3/12 257/414 |
| 2005/0005411 A1* | 1/2005 | Kawauchi | H03H 9/1021 29/25.35 |
| 2005/0139644 A1* | 6/2005 | Brese | B23K 35/025 228/248.1 |
| 2005/0178820 A1* | 8/2005 | Morgenstern | B81C 1/00269 228/246 |
| 2007/0170819 A1* | 7/2007 | Kuwahara | H03H 3/04 310/344 |
| 2007/0176518 A1* | 8/2007 | Moriya | H03H 9/1021 310/348 |
| 2007/0193991 A1* | 8/2007 | Yamasaki | B23K 1/0056 219/121.85 |
| 2007/0199925 A1* | 8/2007 | Kigawa | H01L 21/50 219/121.64 |
| 2008/0231145 A1* | 9/2008 | Nagano | B22F 1/0074 310/344 |
| 2008/0309418 A1* | 12/2008 | Fukunaga | H03H 9/0552 331/68 |
| 2009/0102323 A1* | 4/2009 | Hashimoto | H03H 9/0519 310/351 |
| 2009/0224634 A1* | 9/2009 | Murakami | H03H 9/1021 310/348 |
| 2009/0309459 A1* | 12/2009 | Ogashiwa | B22F 1/0074 310/348 |
| 2010/0104887 A1* | 4/2010 | Yamamoto | H01L 23/04 428/576 |
| 2010/0117489 A1* | 5/2010 | Takahashi | H03H 9/0595 310/344 |
| 2010/0213794 A1* | 8/2010 | Ishihara | H03H 9/1021 310/348 |
| 2010/0258538 A1* | 10/2010 | Suzuki | B23K 26/02 219/121.14 |
| 2011/0114353 A1* | 5/2011 | Iizuka | H01L 23/053 174/50.5 |
| 2011/0163637 A1* | 7/2011 | Hashi | H03H 9/0519 310/344 |
| 2011/0206940 A1* | 8/2011 | Engert | B23K 37/00 428/600 |
| 2011/0291524 A1* | 12/2011 | Kawase | H03H 9/0595 310/312 |
| 2012/0152585 A1* | 6/2012 | Maeda | H01L 23/053 174/50.51 |
| 2012/0177853 A1* | 7/2012 | Gruenwald | H01L 23/055 428/34.4 |
| 2012/0187805 A1* | 7/2012 | Kohda | H03H 9/1021 310/363 |
| 2012/0280597 A1* | 11/2012 | Kishimoto | H03H 9/1035 310/344 |
| 2013/0074597 A1* | 3/2013 | Ichikawa | G01C 19/5628 73/504.15 |
| 2013/0098654 A1* | 4/2013 | Iizuka | H01L 23/49805 174/50.5 |
| 2013/0135055 A1* | 5/2013 | Harima | H03H 9/0547 331/116 R |
| 2013/0263660 A1* | 10/2013 | Shibata | G01C 19/56 73/504.02 |
| 2013/0264109 A1* | 10/2013 | Kamakura | H05K 1/181 174/520 |
| 2013/0279136 A1* | 10/2013 | Sato | G01C 19/5783 361/774 |
| 2014/0043779 A1* | 2/2014 | Nakayama | H05K 3/30 361/752 |
| 2014/0083735 A1* | 3/2014 | Kohda | H03H 9/21 174/50.5 |
| 2014/0111919 A1* | 4/2014 | Miyasaka | H01L 41/23 361/679.01 |
| 2014/0146451 A1* | 5/2014 | Aoki | H03H 9/1014 361/679.01 |
| 2014/0211384 A1* | 7/2014 | Aoki | G01C 19/5783 361/679.01 |
| 2014/0231060 A1* | 8/2014 | Sommerfeldt | B23K 1/0056 165/185 |
| 2014/0254983 A1* | 9/2014 | Moriya | G02B 6/4251 385/18 |
| 2014/0291010 A1* | 10/2014 | Chiba | G01P 15/09 174/520 |
| 2015/0015341 A1* | 1/2015 | Kojo | H03B 5/32 331/158 |
| 2015/0162521 A1* | 6/2015 | Kojo | H03B 5/364 310/344 |

FOREIGN PATENT DOCUMENTS

| | | | |
|---|---|---|---|
| JP | 63137574 A * | 6/1988 | |
| JP | EP 0287722 A1 * | 10/1988 | B23K 26/206 |
| JP | 11-041050 | 2/1999 | |
| JP | 2001-185986 A | 7/2001 | |
| JP | 2002-043769 A | 2/2002 | |
| JP | 2003-158211 A | 5/2003 | |
| JP | 2004-304017 A | 10/2004 | |
| JP | 2006-114601 A | 4/2006 | |
| JP | 2006-261158 A | 9/2006 | |
| JP | 2007-173974 A | 7/2007 | |
| JP | 2009-054750 A | 3/2009 | |
| JP | 2009-295780 A | 12/2009 | |
| JP | 2010-175341 A | 8/2010 | |
| JP | 2010-178113 A | 8/2010 | |
| WO | WO-03-044857 A1 | 5/2003 | |

* cited by examiner

METHOD OF MANUFACTURING ELECTRONIC DEVICE, ELECTRONIC APPARATUS, AND MOBILE APPARATUS

BACKGROUND

1. Technical Field

The present invention relates to a method of manufacturing an electronic device for improving a method of welding a container main body and a lid member, and an electronic apparatus and a mobile apparatus using the device.

2. Related Art

For a structure for air-tightly sealing an electronic element within a container, an electronic element is placed within a ceramic container main body with one face opened and electrical conduction is established between the electronic element and container main body side wiring using a conductive member, and then, a technique of sealing a sealing part formed in an opening peripheral edge part of the container main body and a metal lid member by seam welding (resistance welding), a technique of joining them using a laser beam or an electron beam, or the like has been used.

Patent Document 1 (JP-A-2010-178113) has disclosed a piezoelectric device manufactured using seam welding. The piezoelectric device includes a container for electronic element and a piezoelectric element. The container for the electronic element includes a container main body having a recessed part and a lid member.

In the container main body, a frame part is provided on one principal surface of a substrate part and the recessed part is formed. The substrate part forming the container main body is formed by stacking of a plurality of layers of a ceramic material such as alumina ceramics, for example. The frame part is formed using a metal such as Kovar and a seal ring in a frame shape having a hollow part is used. Further, the frame part is connected to metalization formed on the one principal surface of the substrate part by brazing or the like. Further, a pair of element mounting pads are provided on the one principal surface of the substrate part. Furthermore, a plurality of mounted terminals are provided on the other principal surface of the container main body.

The lid member is formed using a 42 Alloy, Kovar or the like, and has an inclining part with a thickness larger from the outside edge part toward the inside provided on the principal surface facing the recessed part side. The lid member is provided on the frame part of the container main body within a predetermined atmosphere, a roller electrode of a seam welding machine is brought into contact with the lid member, and the roller electrode is moved along the outer peripheral edge of the lid member while a current is flown in the roller electrode, and thereby, the lid member is joined to the frame part.

The inclining part is provided from the outside edge part toward the inside in the lid member, contact between the roller electrode and a carrier jig may be prevented. Further, by increasing the tilt angle of the roller electrode, the width of the contact (joint width) between the lid member and the frame part may also be made smaller. It is disclosed that thermal stress (residual stress) on the container main body may be reduced thereby, and cracking, chipping, or the like produced in the container main body may be prevented.

However, recently, containers have been getting smaller and smaller, and, if an inclination is formed to increase the thickness from the end edge toward the center of the lid member in the structure of the lid member as disclosed in Patent Document 1, there has been a problem that it is difficult to avoid occurrence of cracking of the container main body due to thermal stress (residual stress) generated at welding because the thickness of the lid member itself is only about 0.1 mm.

SUMMARY

An advantage of some aspects of the invention is to provide a method of manufacturing an electronic device to provide a stress relaxation part that relaxes thermal stress (residual stress) generated at welding in a lid member, an electronic device using the manufacturing method, an electronic apparatus, and a mobile apparatus.

The invention can be implemented as the following forms or application examples.

APPLICATION EXAMPLE 1

This application example is directed to a method of manufacturing an electronic device including: preparing an electronic element, a base substrate having a recessed part and including a sealing part on a peripheral edge of the recessed part, and a lid member including a base material layer of a metal as a material and a brazing filler metal layer, placing the electronic element in a bottom part of the recessed part, placing the lid member on the base substrate so that the sealing part and the brazing filler metal layer may overlap, and joining the lid member to the sealing part by application of an energy beam so that a plate thickness of the lid member may be larger in a part joined to the sealing part than in a part located inside of the part in a plan view along the thickness direction.

According to the manufacturing method, when the lid member is energy-beam-joined to the sealing part of the base substrate at manufacturing of the electronic device, e.g., a piezoelectric vibrator, residual stress is generated when a container is returned to the normal temperature due to the difference in linear coefficient of expansion between the lid member and the base substrate and the deflection of the temperature distribution of the respective parts of them. However, there is an advantage that the residual stress is absorbed and reduced by the so-called stress relaxation part larger in the part in which the sealing part and the lid member are joined than in the part located inside in the plan view along the thickness direction, and cracking or the like is not produced in the container and defective leak of the electronic device may be significantly reduced.

APPLICATION EXAMPLE 2

This application example is directed to the method of manufacturing the electronic device according to Application Example 1, wherein the joining includes forming the part in which the plate thickness of the lid member is smaller by movement of the brazing filler metal.

According to the manufacturing method, by appropriate application of the energy beam, the part having the smaller plate thickness may be formed in the lid member and the thinner part acts as the stress relaxation part, and there is an advantage that production of cracking in the base substrate may be prevented and the electronic device with advantageous air-tightness may be obtained.

APPLICATION EXAMPLE 3

This application example is directed to a method of manufacturing an electronic device including: preparing an electronic element, a base substrate having a recessed part and including a sealing part on a peripheral edge of the recessed part, and a lid member including a base material layer of a metal as a material and a brazing filler metal layer and having a stress relaxation part in a part in a plan view along a thickness direction, placing the electronic element in a bottom part of the recessed part, placing the lid member on the base substrate so that the sealing part and the brazing filler metal layer may overlap and the stress relaxation part and the recessed part may overlap in the plan view along the thickness direction, and joining the lid member to the sealing part by application of an energy beam.

According to the manufacturing method, the recessed part of the base substrate and the lid member having the stress relaxation part in the part in the plan view along the thickness direction are energy-beam-joined to overlap, and thereby, there is an advantage that the residual stress generated by joining is reduced by the stress relaxation part, production of cracking in the base substrate is prevented, and the electronic device with the higher air-tightness is obtained.

APPLICATION EXAMPLE 4

This application example is directed to the method of manufacturing the electronic device according to Application Example 3, wherein the stress relaxation part has a smaller plate thickness than another part of the lid member.

According to the manufacturing method, the stress relaxation part has the smaller plate thickness than the other part of the lid member, and thereby, there is an advantage that the residual stress generated when the base substrate and the lid member are energy-beam-joined is reduced by the stress relaxation part, production of cracking in the base substrate is prevented, and the electronic device advantageous in air-tightness is obtained.

APPLICATION EXAMPLE 5

This application example is directed to the method of manufacturing the electronic device according to Application Example 3, wherein the stress relaxation part bends along the thickness direction.

According to the manufacturing method, the stress relaxation part bends along the thickness direction, and thereby, there is an advantage that the residual stress generated when the base substrate and the lid member are energy-beam-joined is relaxed, production of cracking in the base substrate is prevented, and the electronic device advantageous in air-tightness is obtained.

APPLICATION EXAMPLE 6

This application example is directed to an electronic apparatus including: an electronic device manufactured by a method of manufacturing an electronic device including preparing an electronic element, a base substrate having a recessed part and including a sealing part on a peripheral edge of the recessed part, and a lid member including a base material layer of a metal as a material and a brazing filler metal layer, placing the electronic element in a bottom part of the recessed part, placing the lid member on the base substrate so that the sealing part and the brazing filler metal layer may overlap, and joining the lid member to the sealing part by application of an energy beam so that a plate thickness of the lid member may be larger in a part joined to the sealing part than in a part located inside of the part in a plan view along the thickness direction.

According to the configuration, the electronic apparatus is formed using the electronic device having good air-tightness, frequency accuracy, frequency-temperature characteristics, and aging characteristics, and thereby, there is an advantage that the electronic apparatus having a stable frequency over a long period may be obtained.

APPLICATION EXAMPLE 7

This application example is directed to a mobile apparatus including: the electronic device according to the application example 6.

According to the configuration, the mobile apparatus is formed using the small electronic device with good air-tightness, electrical characteristics, frequency-temperature characteristics, and aging characteristics, and thereby, there is an advantage that the mobile apparatus may be downsized and the mobile apparatus having a stable frequency over a long period may be obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

As below, an embodiment of the invention will be explained in detail with reference to the drawings.

Figure 1A:
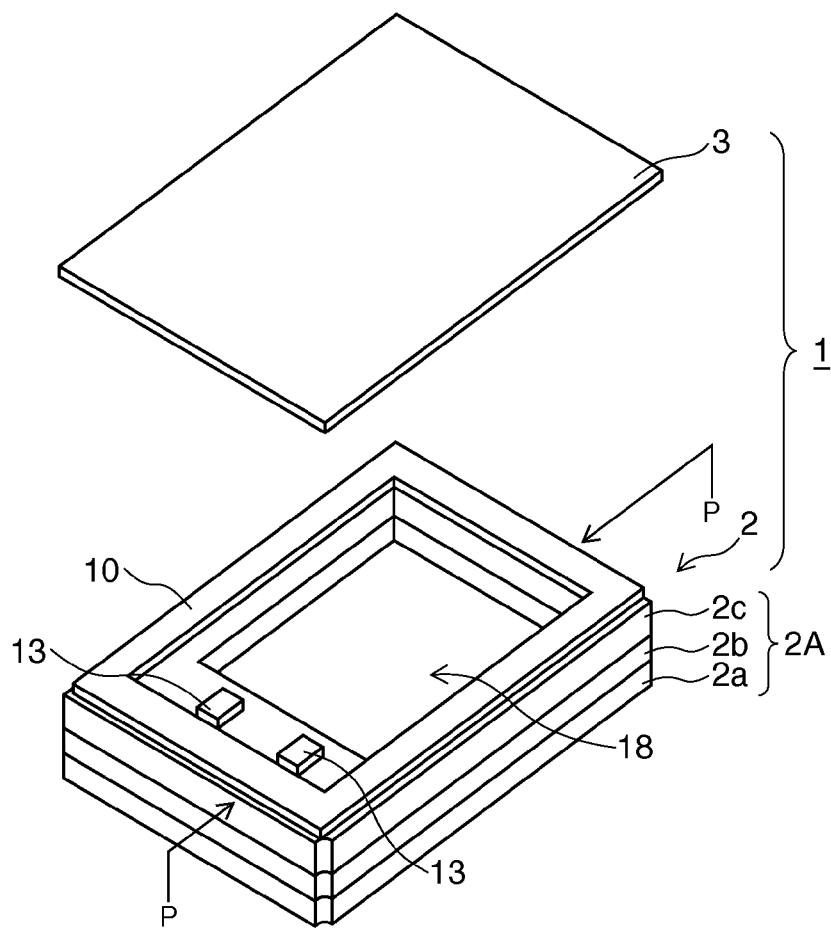
FIG. 1A is an exploded perspective view of an electronic device container.
Figure 1B:
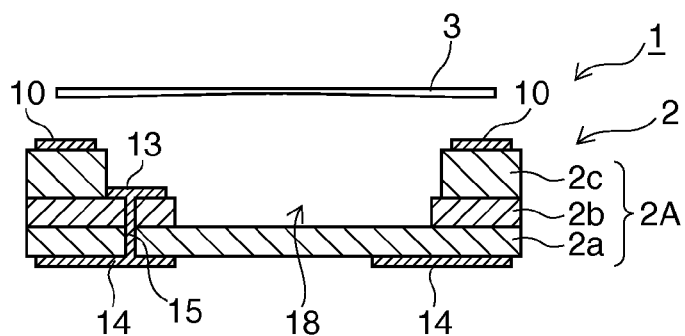
FIG. 1B is a P-P sectional view.
Figure 1C:
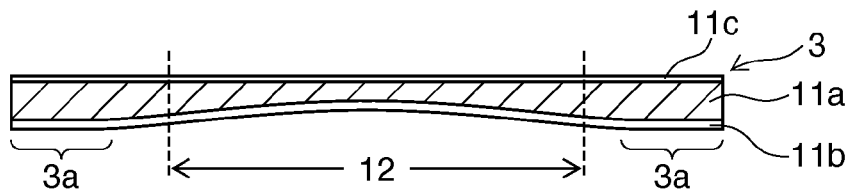
FIG. 1C is a sectional view of a lid member according to an embodiment of the invention.

FIG. 1A is an exploded perspective view of one embodiment of an electronic device container 1 according to the invention, FIG. 1B is a P-P sectional view of FIG. 1A, and FIG. 1C is an enlarged sectional view of a lid member 3.

The container 1 that contains an electronic element includes a ceramic base substrate (container main body) 2 having a recessed part on which the electronic element can be mounted, and the lid member 3 that air-tightly seals a recessed part (cavity) 18 provided on one surface of the base substrate 2.

The summary of the method of manufacturing the electronic device container 1 is as follows. That is, the method of manufacturing the electronic device container 1 which includes the base substrate 2 having an insulating substrate 2A using ceramic as a material and the metal lid member 3. The method includes preparing the base substrate 2 having the recessed part 18 and including a sealing part 10 on a peripheral edge of the recessed part and the lid member 3 containing a base material layer and a brazing filler metal layer, placing the lid member on the base substrate so that the sealing part and the brazing filler metal layer may overlap, and joining the lid member to the sealing part by applying an energy beam so that a plate thickness of the lid member may be larger in a part joined to the sealing part than in a part located inside in a plan view along a thickness direction. Here, the base material layer uses a metal as a material.

In other words, the method of manufacturing the electronic device container according to the invention includes preparing the base substrate 2 having the recessed part (cavity) 18 and including the sealing part (metalization layer) 10 on the upper peripheral edge of the recessed part (cavity) 18, preparing the lid member 3 having a lid member base material layer 11a and a brazing filler metal layer 11b stacked on the entire one principal surface of the lid member base material layer 11a and having a stress relaxation part 12 in a location corresponding to the recessed part (cavity) 18, placing the lid member 3 on the base substrate 2 so that the sealing part (metalization layer) 10 may be aligned with the brazing filler metal layer 11b, and joining the lid member 3 to the sealing part (metalization layer) 10 by applying an energy beam (including a laser beam and an electron beam) to the peripheral edge of the lid member 3.

The base substrate 2 includes the insulating substrate 2A formed by stacking of a lower layer plate 2a having a flat plate shape, for example, an intermediate layer plate 2b having a hollow frame shape, and an upper layer plate 2c having a hollow frame shape made of a ceramics material, the metalization layer 10, etc. The lower layer plate 2a forms the bottom part of the base substrate 2, the intermediate layer plate 2b forms the mounting surface of the electronic element, and the upper layer plate 2c having the hollow frame shape forms the internal space (cavitation) of the base substrate 2 with the intermediate layer plate 2b. The ceramic base material (insulating substrate 2A) forming the lower layer plate 2a, the intermediate layer plate 2b, and the upper layer plate 2c of ceramic substrates is formed by shaping, processing, and firing a green sheet.

A plurality of element mounting pads 13 for mounting of electronic elements are formed on the upper surface near one end part of the intermediate layer plate 2b, and the element mounting pads 13 electrically conduct to mounted terminals 14 on the outer bottom surface of the base substrate 2 via a plurality of penetrating vias 15.

The metalization layer (sealing part) 10 is formed on the upper peripheral edge of the upper layer plate 2c. The metalization layer (sealing part) 10 is formed by metalization printing (tungsten W or the like), firing, nickel (Ni) plating, seal ring brazing, gold (Au) plating, or the like, for example. Further, recently, a method of forming a metalization layer of copper (Cu), nickel (Ni), gold (Au), or the like on a ceramic substrate surface using a semi-additive method has been developed. The method is to form a predetermined metalization layer using deposition of a metal film (copper Cu) by sputtering on a fired green sheet, a photolithography technology, plating (Ni+Au), or an etching technique without heating at a high temperature. The latter metalization layer (sealing part) is advantageous in flatness.

Further, a plurality of the mounted terminals 14 for connection to external wiring are provided on the outer bottom surface of the base substrate 2.

In the above explanation, the example of the base substrate 2 in which the ceramics substrates are stacked in three layers has been explained, however, two, four, or more layers of substrates may be stacked. Further, the element mounting pads 13 and the penetrating vias 15 shown in FIG. 1B are just examples, but other wiring examples may be used. Furthermore, it is desirable to provide penetrating vias that conduct the sealing part (metalization layer) 10 and the grounding mounted terminals 14 if necessary. In the case where the container 1 according to the invention is used for an electronic device or the like, the metal lid member 3 is held at the ground potential, and thereby, protection from unnecessary electrical signals from outside, e.g., noise may be achieved or unwanted radiation to outside may be prevented by the shielding effect of the lid member 3.

In addition, the metal lid member 3 is formed so that the thickness of the lid member 3 may be smaller from the outer peripheral edge toward the center part as shown in the sectional view of FIG. 1C. Further, the lid member 3 includes the lid member base material layer 11a of Kovar (linear coefficient of expansion: 5.5 ppm/° C.) as a metal material having a linear coefficient of expansion near the linear coefficient of expansion (7 ppm/° C.) of the ceramic substrates (lower layer plate 2a, intermediate layer plate 2b, upper layer plate 2c) forming the base substrate 2, the brazing filler metal layer 11b stacked on the lower surface of the lid member base material layer 11a by cladding, e.g., silver brazing filler, and an antioxidant nickel film 11c stacked on the upper surface of the lid member base material layer 11a by cladding. Note that, as the material for the lid member base material layer 11a, not only Kovar but also 42 nickel (an alloy containing 42% of nickel and iron, also referred to as 42 alloy), SUS, or the like may be used.

Figure 2:
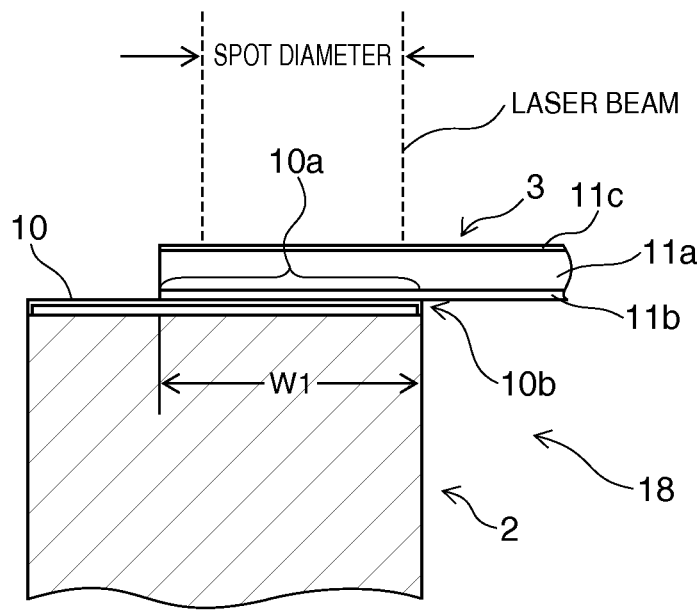
FIG. 2 is a sectional view showing an enlarged part of the electronic device container for explanation of an energy beam welding method.

FIG. 2 is a diagram for explanation of a method of joining the electronic device container using an energy beam (e.g., laser beam), and a longitudinal sectional view showing an enlarged part of the container in FIGS. 1A to 1C. On the sealing part (metalization layer) 10 in the frame shape of the base substrate 2, the metal lid member 3 is aligned and placed to join to the brazing filler metal layer 11b, and the energy beam is applied to the peripheral edge of the lid member 3. The application location of the energy beam when the sealing part (metalization layer) 10 and the peripheral edge part of the metal lid member 3 are joined is set so that the center part of the spot diameter of the energy beam may substantially coincide with the center part of the width dimension W1 of a joining part 10a of the sealing part (metalization layer) 10 and the lid member 3 as shown in FIG. 2. An example of the spot diameter of the energy beam is about 100 μm, and an example of the width dimension W1 of the joining part 10a is about 150 μm. The energy of the energy beam is the maximum in the center part of the spot diameter and the energy decreases with distance from the center part. Note that the center part of the spot diameter may be deflected to be nearer the center of the lid member 3 than the center part of the width dimension W1 of the joining part 10a so that the end of the spot diameter may be located on an inner end part 10b of the joining part 10a or over the end part. The center location of the energy beam and the end part location are set in this manner, and thereby, the brazing filler metal layer 11b on the rear surface of the lid member 3 may be melted uniformly and reliably and developed uniformly in a necessary and sufficient range.

Figure 4A:
FIG. 4A is a plan view of a lid member of another embodiment.
Figure 4B:
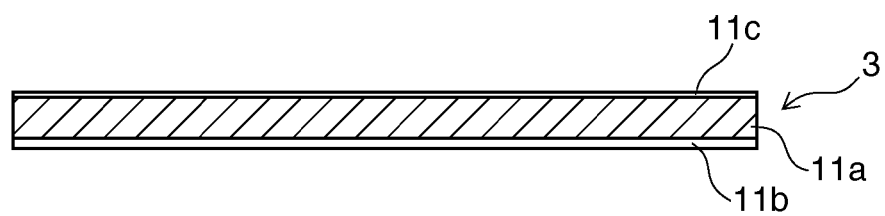
FIG. 4B is a sectional view.

When the metal lid member 3 having the flat plate shape as shown in FIGS. 4A and 4B is placed to be aligned with the sealing part (metalization layer) 10 in the frame shape formed on the upper peripheral edge of the upper layer plate 2c of the base substrate 2, and the energy beam (e.g., a laser beam, an electron beam, or the like) is applied to the part in which the lid member 3 is joined, the brazing filler metal layer 11b as a joining member of an alloy having the lower melting point, for example, silver brazing filler is melted, solidified, and joined, and the container 1 is air-tightly sealed. In this regard, the metal lid member 3 generates heat by the application of the energy beam, and the heat is conducted to the sealing part (metalization layer) 10 via the brazing filler metal layer 11b and conducted to the upper layer plate 2c, the intermediate layer plate 2b, and the lower layer plate 2a of the base substrate 2, and the temperature distribution of the heat is not uniform but the temperature differences are caused in the respective parts. In addition, the ceramic substrates forming the base substrate 2 and the Kovar forming the lid member 3 have different linear coefficients of expansion, and, when the container 1 is sealed and the container 1 is returned to the normal temperature, residual stress is generated between the base substrate 2 and the lid member 3 via the brazing filler metal layer 11b. In response to downsizing of the container 1, the base substrate 2 becomes brittle to the stress and cracking may be produced in the ceramic material (e.g., the upper layer plate 2c) of the base substrate 2.

Accordingly, in the first embodiment of the invention, as shown in FIG. 1C, in the section shape of the lid member 3, an outer periphery region 3a joined to the sealing part (metalization layer) 10 in the frame shape of the base substrate 2 has a uniform thickness and the stress relaxation part 12 is formed to have a thickness to be smaller from the region toward the center part of the lid member 3. As described above, the region that deforms because of the tensile force, i.e., the stress relaxation part 12 is provided in a part of the lid member 3, and thereby, the residual stress generated by joining may be absorbed and reduced by the stress relaxation part 12, the stress on the ceramic material of the base substrate 2 is reduced, and production of cracking is prevented.

Note that, in the example, while the outer periphery region 3a has the uniform thickness, the thickness of the stress relaxation part 12 is gradually reduced with inclinations, however, a step part may be provided at the boundary between the outer periphery region 3a and the stress relaxation part 12. Further, the thickness of the stress relaxation part 12 may be made uniform over the entire part, or the thickness may be gradually reduced from the outer peripheral part toward the center part as shown in FIG. 1C.

Figure 3A:
FIG. 3A is a plan view of a lid member of another embodiment.
Figure 3B:
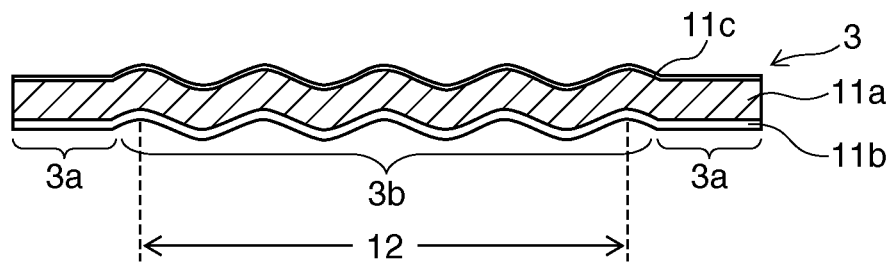
FIG. 3B is a sectional view.

FIGS. 3A and 3B show the second embodiment of the lid member 3, and FIG. 3A is a plan view and FIG. 3B is a sectional view taken along P-P of FIG. 3A. The second embodiment is characterized in that, in the section shape of the lid member 3, the outer periphery region 3a joined to the sealing part (metalization layer) 10 in the frame shape has a uniform thickness, an inner region 3b nearer the center of the lid member 3 than the outer periphery region 3a has a wave shape (non-flat shape) and the inner region is used as the stress relaxation part 12. As described above, the stress relaxation part 12 having the non-flat shape is formed, and thereby, the residual stress generated by joining is absorbed and reduced by the stress relaxation part, the stress on the ceramic material of the base substrate 2 is reduced, and production of cracking is prevented.

Further, the section shape of the lid member 3 forming the stress relaxation part 12 having the non-flat shape may be a saw-teeth shape. By the non-flat shape, the residual stress may be absorbed and reduced, the stress on the ceramic material of the base substrate 2 maybe reduced, and production of cracking may be prevented.

Figure 5:
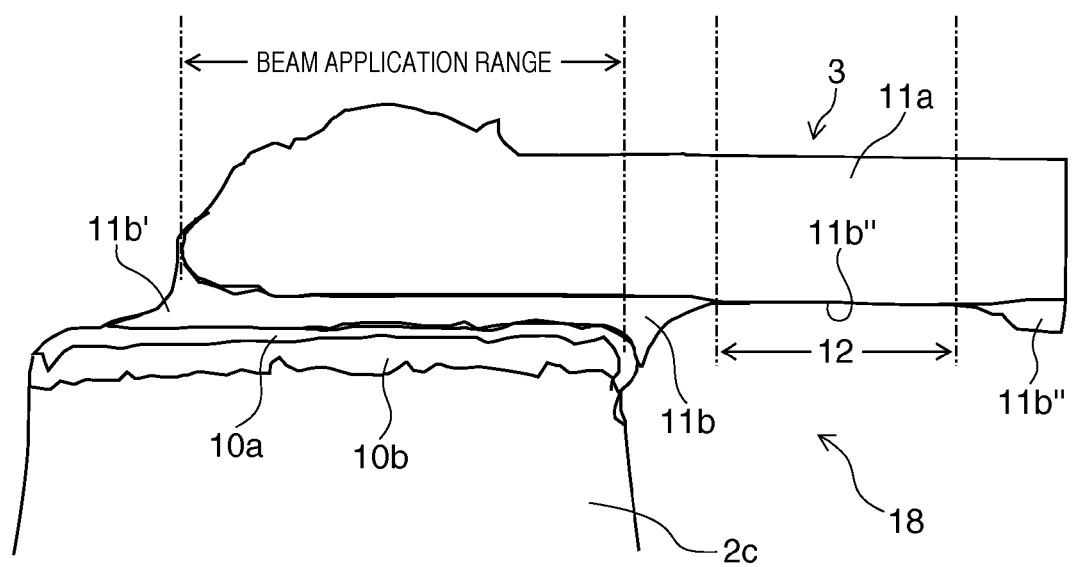
FIG. 5 is a partially enlarged sectional view of a container using a lid member having a flat plate shape.

FIGS. 4A and 4B show the third embodiment of the lid member 3, and FIG. 4A is a plan view and FIG. 4B is a sectional view taken along P-P of FIG. 4A. Here, a method of relaxing residual stress using the general lid member 3 in the flat plate shape as shown in FIGS. 4A and 4B has been studied. In the joining experiment of the sealing part (metalization layer) 10 of the base substrate 2 and the lid member 3 having a rectangular section shape as shown in FIG. 4B, the joining condition including the output, the spot diameter, the application location, the application time, etc. of the energy beam has varied and joining has been performed. The air-tightness of the container has been measured, the joined section is taken as an SEM photograph, and the relationship between the state in which the brazing filler metal layer 11b is melted and solidified and the joining condition has been studied. FIG. 5 shows an example of a schematic diagram of an SEM photograph obtained in the experiment.

As is clear from FIG. 5, it is known that, in the outer end part (on the left in FIG. 5) of the lid member 3, the upper surface raises like a mound by application of the energy beam, and a brazing filler metal layer 11b' has sufficient wettability and climbs a part of the outer end part of the lid member 3. Further, it is clear from the drawing that the brazing filler metal layer 11b' is sufficiently melted on the bottom surface of the lid member 3 in the joining part and solidified due to the surface tension.

Furthermore, it has been found out that, in FIG. 5, a brazing filler metal layer 11b" nearer the cavity 18 than the joining part of the sealing part 10 and the lid member 3 is melted and attracted to the joining part by the surface tension and a region without the brazing filler metal layer 11b" is produced at the cavity 18 side. From the study on the relationship between the air-tightness of the container 1 and the region without the brazing filler metal layer 11b" (referred to as "stress relaxation part"), it has been turned out that the container energy-beam-joined under the joining condition in which the stress relaxation part is produced is extremely good in production yield of air-tightness. That is, FIG. 5 shows the state in which the brazing filler metal layer 11b" at the cavity 18 side close to the sealing part 10 is melted by the energy beam application, attracted to between the sealing part 10 and the lid member 3 by the surface tension, and solidified. It has been found out that the brazing filler metal layer 11b" at the cavity 18 side near the joining part is attracted to the joining part 10a and the region without the brazing filler metal layer 11b" is formed, and the region functions as the stress relaxation part 12 for the residual stress, i.e., the stress relaxation part 12 absorbs and reduces the residual stress generated by joining.

It has been found out that, even with the lid member 3 having the flat plate shape without changes in thickness and shape, by properly setting the joining condition including the output, the spot diameter, the application location, the application time, etc. of the energy beam, the brazing filler metal layer 11b at the cavity side close to the sealing part 10 is melted and attracted to the joining part 10a by the surface tension, the region without the brazing filler metal layer 11b", i.e., the stress relaxation part 12 is formed at the cavity 18 side close to the sealing part 10 and absorbs and reduces the residual stress, and production of cracking in the ceramic material may be prevented.

As explained above, when the lid member 3 is energy-beam-joined to the sealing part 10 of the base substrate 2, residual stress is generated when the container 1 is returned to the normal temperature due to the difference in linear coefficient of expansion between the base substrate 2 and the lid member 3 and the deflection of the temperature distribution of the respective parts of them, however, there is an advantage that the residual stress is absorbed and reduced by the stress relaxation part 12 provided in the lid member 3 and cracking or the like is not produced in the container 1.

Further, as shown in FIG. 1C, the thickness of the stress relaxation part 12 is made smaller than that in the other part of the lid member 3, i.e., the outer peripheral region 3a, and thereby, there is an advantage that the residual stress generated at energy beam joining may be further absorbed and reduced and cracking or the like is not produced in the container 1.

Furthermore, as shown in FIGS. 3A and 3B, the shape of the stress relaxation part is formed to be the non-flat plate shape, e.g., the wave shape in response to the size of the container, and thereby, there is an advantage that the residual stress may be further absorbed and reduced and cracking or the like is not produced in the container.

As shown in FIG. 5, by properly setting the joining condition including the output, the spot diameter, the application location, the application time, etc. of the energy beam, there is an advantage that the stress relaxation part 12 may be formed in the lid member 3 using the lid member 3 in the flat plate shape that is easily manufactured at the lower cost and the residual stress generated at energy beam joining may be absorbed and reduced and cracking or the like is not produced in the container 1.

Figure 6:
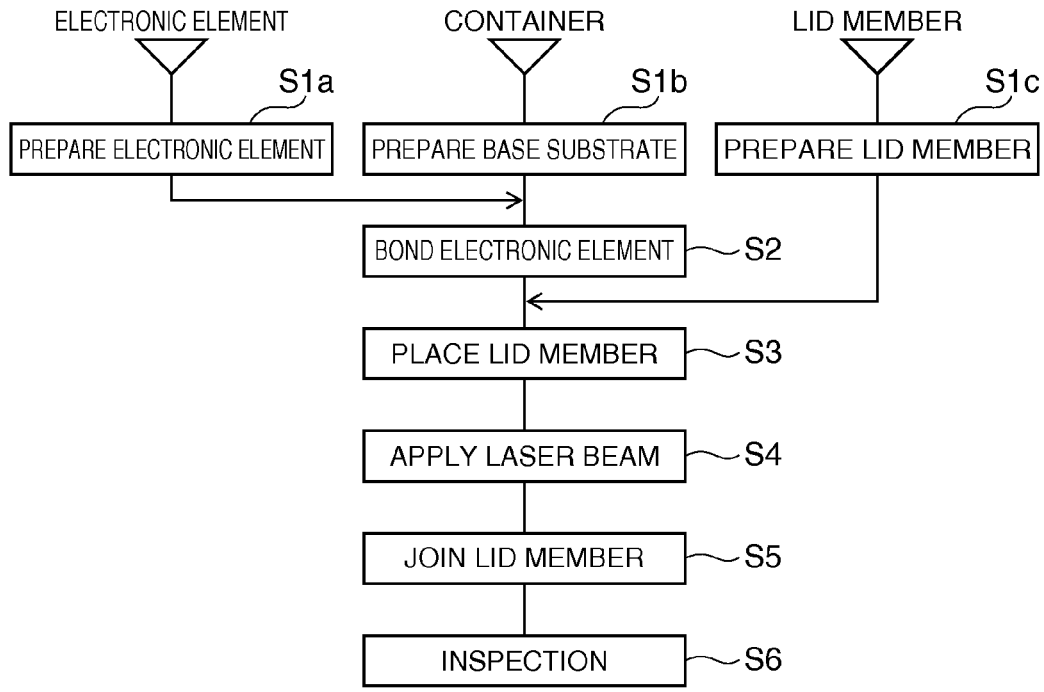
FIG. 6 is a flowchart showing a manufacturing procedure of an electronic device.

Next, FIG. 6 is a flowchart showing an example of a method of manufacturing an electronic device according to the invention. FIG. 6 is the flowchart for explanation of a method of manufacturing an electronic device 5 shown in FIG. 7A, and an electronic device 6 of FIG. 7B may be manufactured in the same procedure.

First, the summary of a method of manufacturing an electronic device container according to the invention is as follows.

The method includes preparing the base substrate 2 having the recessed part 18 and including the sealing part 10 on the peripheral edge of the recessed part and the lid member 3 having the base material layer of a metal as a material and the brazing filler metal layer, placing the lid member on the base substrate so that the sealing part and the brazing filler metal layer may overlap, and joining the lid member to the sealing part by application of an energy beam so that a plate thickness of the lid member may be larger in a part joined to the sealing part than in a part located inside thereof in a plan view along the thickness direction.

Next, the summary of the method of manufacturing the electronic device according to the invention is as follows.

That is, the method includes preparing the base substrate 2 having the recessed part 18 and including the sealing part 10 on the peripheral edge of the recessed part 18, preparing the lid member 3 having the lid member base material layer 11a and the brazing filler metal layer 11b stacked on the entire one principal surface of the lid member base material layer 11a and having the stress relaxation part 12 in a location corresponding to the recessed part 18, placing an electronic element 30 in the recessed part 18, placing the lid member 3 on the base substrate 2 so that the sealing part 10 may be aligned with the brazing filler metal layer 11b, and joining the lid member 3 to the sealing part 10 by applying an energy beam to the lid member 3 (S1a to S6).

According to the manufacturing method, there is an advantage that, at the manufacturing of the electronic device, e.g., the piezoelectric vibrator 5, the residual stress generated when the lid member 3 is energy-beam-joined to the base substrate 2 may be absorbed and reduced, and defective air-tightness of the piezoelectric vibrator 5 may be significantly reduced.

Figure 7A:
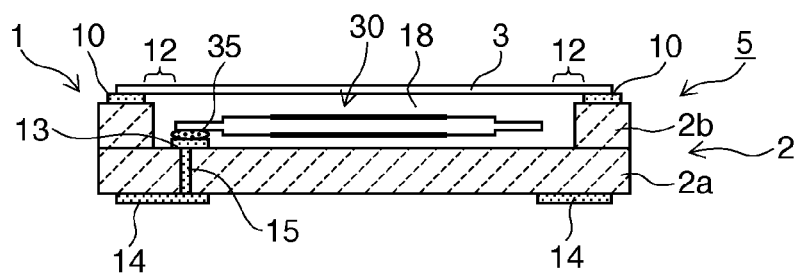
FIG. 7A is a sectional view of an electronic device (piezoelectric vibrator) and FIG. 7B is a sectional view of another electronic device (piezoelectric oscillator).

FIG. 7A is a longitudinal sectional view showing a configuration of the piezoelectric vibrator 5 as an example of the embodiment of the electronic device according to the invention. The piezoelectric vibrator 5 includes the electronic element (piezoelectric vibrating element) 30 and the container 1 containing the electronic element 30. The container 1 includes the base substrate 2 having the recessed part (cavity) 18 and the metal lid member 3. The brazing filler metal layer 11b is formed on the entire surface of the lid member 3 joined to the base substrate 2. The base substrate 2 has two layers of insulating substrates (lower layer plate, upper layer plate) as shown in FIG. 7A, and formed by firing of a ceramic green sheet of aluminum oxide as an insulating material. The sealing part 10 having the frame shape includes multiple metallization layers. Further, a pair of the element mounting pads 13 are formed on the bottom surface of the recessed part (cavity) 18. A plurality of the mounted terminals 14 are formed on the outer bottom surface of the container main body.

The element mounting pads 13 and the mounted terminals 14 formed on the insulating substrate forming the base substrate 2 are electrically conducted via the penetrating vias 15. The locations of the element mounting pads 13 are made to correspond to pad electrodes of the electronic element 30 when the electronic element 30 is mounted.

An example of the electronic element (piezoelectric vibrating element) 30 generally includes a quartz substrate, a pair of excitation electrodes, lead electrodes, and electrode pads. The quartz substrate generally has a mesa structure for downsizing in the case of an AT-cut quartz vibrator. Regarding the quartz substrate having the mesa structure, mass production of quartz substrates having the equal quality may be realized by application of a photolithography technology and an etching technique to a large-sized quartz wafer. The mesa structure of the quartz substrate may be a single-stage structure symmetric with respect to the thickness direction, or a two-stage or three-stage structure depending on the required properties of the quartz vibrator.

The excitation electrodes are formed nearly in the center part of the quartz substrate and form lead electrodes respectively extending toward the electrode pads formed in the end parts of the quartz substrate. Regarding an example of the excitation electrode, a quartz substrate in which, with an electrode film of chromium (Cr) or nickel (Ni) as a foundation, an electrode film of gold (Au) is stacked thereon using sputtering, vacuum evaporation, or the like is formed in a predetermined shape by a photolithography technology. Using the technique, the excitation electrodes, the lead electrodes, and the electrode pads may be formed in predetermined shapes at a time. The size of the excitation electrode may spread to the top part of the mesa structure or a part of the peripheral edge according to the required specification. Further, regarding the size of the excitation electrode, its dimensions may be generally determined to suppress the higher-order flexion mode.

When the electronic element 30 is fixed to the base substrate 2, first, a conductive adhesive 35 is applied to the element mounting pads 13, and the pad electrodes of the electronic element 30 are placed to be aligned with the pads and predetermined load is applied thereon. The conductive adhesive 35 includes a silicon adhesive, an epoxy adhesive, and a polyimide adhesive, and it is preferable to choose an adhesive generating the smaller stress due to the adhesive 35 and generating the smaller amount of gas in consideration of changes with time.

To harden the conductive adhesive 35 of the electronic element 30 mounted on the base substrate 2, they are put into a high-temperature furnace at a predetermined temperature in a predetermined time. The conductive adhesive 35 is hardened and annealing treatment is performed thereon, and then, frequency adjustment is performed by adding a mass to the excitation electrode or reducing the mass of the electrode. The lid member 3 is placed on the sealing part 10 formed on the upper surface of the base substrate 2, the brazing filler metal layer 11b of the lid member 3 and the sealing part 10 are energy-beam-joined and tightly sealed in vacuum within a chamber of an energy beam joining machine or an atmosphere of nitride $N_2$ gas, and thereby, the piezoelectric vibrator 5 is completed.

By forming the electronic device, e.g., the piezoelectric device 5 as shown in FIG. 7A, there is an advantage that, the residual stress of the base substrate 2 is relaxed, and not only that the rate of defective leak may be improved but also that the piezoelectric device advantageous in frequency accuracy, frequency-temperature characteristics, changes with time may be formed.

Figure 7B:
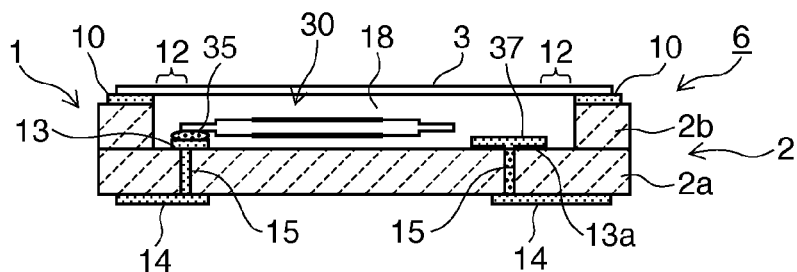

FIG. 7B is a longitudinal sectional view showing an embodiment of the electronic device 6 according to the invention. The electronic device 6 generally includes, for example, the electronic element 30, at least one second electronic element 37, and the container 1 including the base substrate 2 and the lid member 3 and containing the electronic element 30 and the second electronic element 37. The element mounting pad 13 and a component mounting pad 13a are provided on the bottom surface of the cavity 18 of the base substrate 2, and they are conducted to the mounted terminals 14 via the penetrating vias 15. The conductive adhesive 35 is applied to the element mounting pad 13, the pad electrode of the electronic element 30 is placed thereon, predetermined load is applied thereon, and heat treatment is performed for hardening of the conductive adhesive 35. Further, the second electronic element 37 is placed on the component mounting pad 13a and joined using means of ultrasonic bonding or the like. The lid member 3 is placed to be aligned with the sealing part 10 on the upper surface of the base substrate 2, put into a chamber of an energy beam joining machine, energy-beam-joined, and thereby, the electronic device 6 is completed. The interior of the container 1 of the electronic device 6 may be in vacuum or filled with nitride ($N_2$).

In the above described embodiment, it is desirable that the electronic device is formed using at least one of a thermistor, a capacitor, a reactance element, a semiconductor element (an IC including a variable diode, an oscillator circuit, an amplifier, etc.) as the second electronic element 37 contained in the container 1.

Figure 8A:
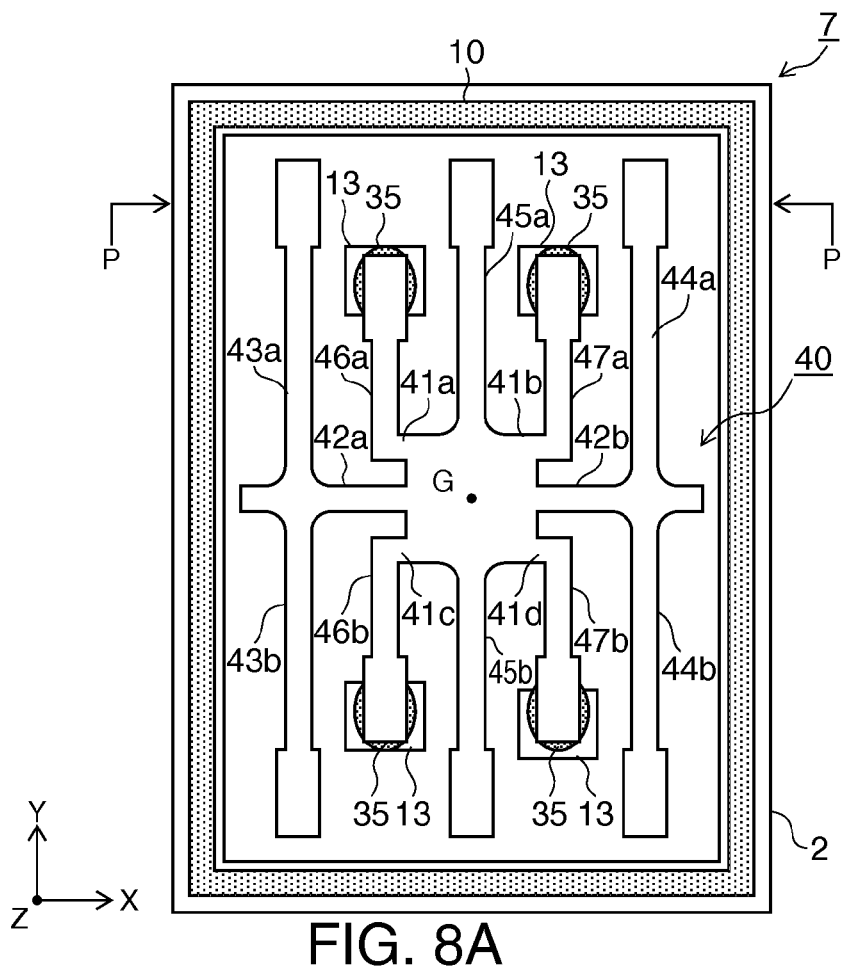
FIG. 8A is a plan view showing a configuration of a gyro sensor.
Figure 8B:
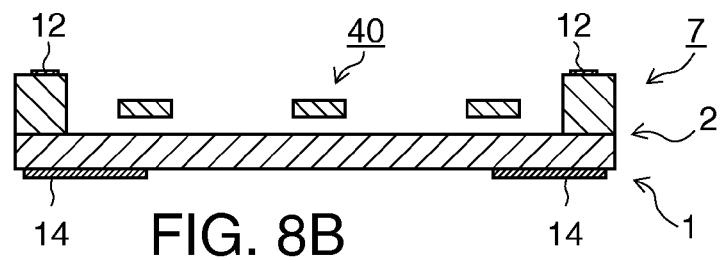
FIG. 8B is a sectional view thereof.

FIG. 8A is a schematic plan view of a gyro sensor 7 formed using the container 1 according to the invention except the lid member 3. FIG. 8B is a sectional view taken along P-P of FIG. 8A. The vibration gyro sensor 7 generally includes a vibration gyro element 40 and the container 1 containing the vibration gyro element 40. As shown in FIGS. 1A and 1B, the container 1 includes the base substrate 2 and the lid member 3 that air-tightly seals the cavity of the base substrate 2.

The vibration gyro element 40 includes a base part 41, and a pair of detection vibrating arms 45a, 45b respectively projected from two opposed end edges of the base part 41 on the same line. Further, the vibration gyro element 40 includes a pair of first connecting arms 42a, 42b respectively projected from the other two opposed end edges of the base part 41 on the same line in a direction orthogonal to the detection vibrating arms 45a, 45b, and respective pairs of drive vibrating arms 43a, 43b and 44a, 44b respectively projected from the end parts of the respective first connecting arms 42a, 42b in both directions orthogonal to the arms.

The vibration gyro element 40 includes respective pairs of second connecting arms 41a, 41b and 41c, 41d respectively projected from the other two opposed end edges of the base part 41 on the same lines in the direction orthogonal to the detection vibrating arms 45a, 45b, and respective pairs of supporting arms 46a, 46b and 47a, 47b respectively projected from the end parts of the respective second connecting arms 41a, 41b and 41c, 41d in both directions orthogonal to the arms and provided between the detection vibrating arms 45a, 45b and the drive vibrating arms 43a, 43b and 44a, 44b.

The excitation electrodes are respectively formed at least on the pair of detection vibrating arms 45a, 45b and the respective pairs of drive vibrating arms 43a, 43b and 44a, 44b. A plurality of electrode pads (not shown) are formed on the supporting arms 46a, 46b and 47a, 47b, and the electrode pads and the excitation electrodes are respectively electrically connected.

In the vibration gyro sensor 7, metal or polymer buffer materials are provided in parts facing the end parts of the respective detection vibrating arms 45a, 45b and the respective drive vibrating arms 43a, 43b and 44a, 44b of the vibration gyro element 40 in the inner surface of the base substrate 2.

Figure 8C:
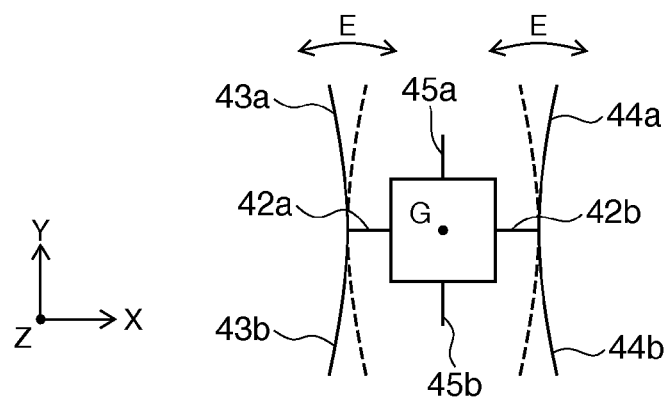
FIG. 8C is a schematic diagram for explanation of movements.

FIG. 8C is a schematic plan view for explanation of movements of the vibration gyro element. Without application of an angular velocity to the vibration gyro sensor 7, the drive vibrating arms 43a, 43b, 44a, 44b flexurally vibrate in directions shown by arrows E. In this regard, the drive vibrating arms 43a, 43b and 44a, 44b vibrate line-symmetrically with respect to the line passing through the center of gravity G along the Y-axis, and thus, the base part 41, the connecting arms 42a, 42b, and the detection vibrating arms 45a, 45b hardly vibrate.

When an angular velocity ω around the Z-axis is applied to the vibration gyro sensor 7, Coriolis forces act on the drive vibrating arms 43a, 43b, 44a, 44b and the first connecting arms 42a, 42b, and a new vibration is excited. The vibration is a vibration in circumferential directions with respect to the center of gravity G. Concurrently, a detection vibration is excited in the detection vibrating arms 45a, 45b in response to the vibration. The detection electrodes formed on the detection vibrating arms 45a, 45b detect distortion generated by the vibration, and thereby, the angular velocity is obtained.

Figure 9:
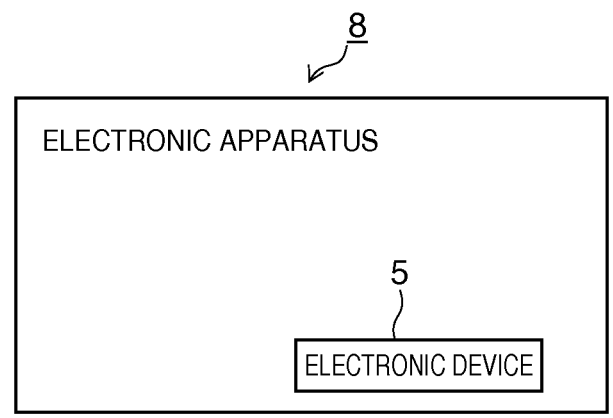
FIG. 9 is a schematic diagram of an electronic apparatus.

FIG. 9 is a schematic configuration diagram showing a configuration of an electronic apparatus according to the invention. An electronic apparatus 8 includes at least one of the electronic devices 5 to 7. The electronic apparatus 8 using the electronic device includes a transmitter. In the electronic apparatus 8, the electronic device is used as a reference signal source, a voltage-controlled oscillator, or the like, and thereby, a small electronic apparatus with good electrical characteristics may be provided.

The electronic apparatus has the above described configuration and the electronic apparatus 8 is formed using the electronic device having good air-tightness, frequency accuracy, frequency-temperature characteristics, and aging characteristics, and thereby, there is an advantage that the electronic apparatus 8 having a stable frequency over a long period may be obtained.

Figure 10:
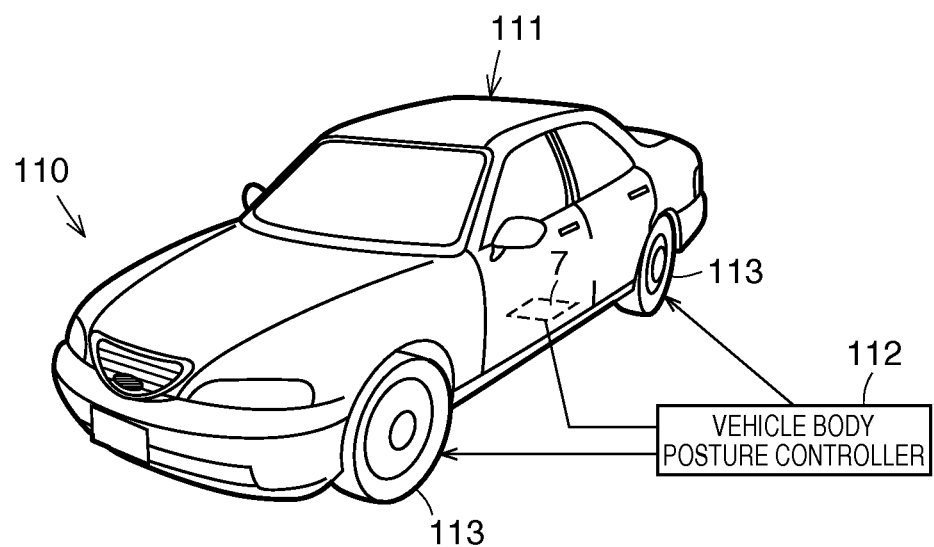
FIG. 10 is an explanatory diagram of a mobile apparatus.

FIG. 10 schematically shows an automobile 110 with a mobile apparatus mounted thereon as one specific example. In the automobile 110, for example, the gyro sensor 7 having the gyro sensor element 40 as shown in FIGS. 8A to 8C is incorporated. The gyro sensor 7 may detect the posture of a vehicle body 111. The detection signal of the gyro sensor 7 may be supplied to a vehicle body posture controller 112. For example, the vehicle body posture controller 112 may control hardness and softness of the suspension in response to the posture of the vehicle body 111 or control brakes of individual wheels 113. In addition, the posture control may be used in a bipedal robot or a radio control helicopter. The gyro sensor 7 is incorporated for realization of posture control.

According to the configuration, the mobile apparatus is formed using the small electronic device with good air-tightness, stable electrical characteristics, and good aging characteristics, and thus, there is an advantage that the mobile apparatus may be downsized and the mobile apparatus having a stable frequency over a long period may be obtained.

The entire disclosure of Japanese Patent Application No. 2012-211896, filed Sep. 26, 2012 is expressly incorporated by reference herein.

What is claimed is:

1. A method of manufacturing an electronic device comprising:
   preparing an electronic element, a base substrate having a recessed part and including a sealing part on a peripheral edge of the recessed part, and a lid member including a base material layer and a brazing filler metal layer extending the length and width of the lid member;
   placing the electronic element in a bottom part of the recessed part;
   placing the lid member on the base substrate so that the sealing part and the brazing filler metal layer may overlap; and
   joining the lid member to the sealing part by application of an energy beam so that a plate thickness of the base material layer and the brazing filler metal layer of the lid member is larger throughout a part joined to the sealing part than in a part located inside of the part in a plan view along the thickness direction.

2. The method of manufacturing an electronic device according to claim 1, wherein the joining includes forming the part of the lid member joined to the sealing part in which the plate thickness of the lid member is smaller by movement of the brazing filler metal layer.

3. A method of manufacturing an electronic device comprising:
   preparing an electronic element, a base substrate having a recessed part and including a sealing part on a peripheral edge of the recessed part, and a lid member including a base material layer and a brazing filler metal layer extending the length and width of the lid member;
   placing the electronic element in a bottom part of the recessed part;
   placing the lid member on the base substrate so that the sealing part and the brazing filler metal layer may overlap; and
   joining the lid member to the sealing part by application of an energy beam so that a difference between a plate thickness of the lid member in a part joined to the sealing part and a plate thickness of the lid member in a part located inside of the part in a plan view along the thickness direction after the application of the energy beam is larger than a difference between a plate thickness of the lid member in a part joined to the sealing part and a plate thickness of the lid member in a part located inside of the part in a plan view along the thickness direction before the application of the energy beam.

4. The method of manufacturing an electronic device according to claim 1, wherein the lid member is joined to the sealing part a difference between a plate thickness of the lid member in a part joined to the sealing part and a plate thickness of the lid member in a part located inside of the part in a plan view along the thickness direction after the application of the energy beam is larger than a difference between a plate thickness of the lid member in a part joined to the sealing part and a plate thickness of the lid member in a part located inside of the part in a plan view along the thickness direction before the application of the energy beam.

5. A method of manufacturing an electronic device comprising:
   preparing an electronic element, a base substrate having a recessed part and including a sealing part on a peripheral edge of the recessed part, and a lid member including a base material layer and a brazing filler metal layer extending the length and width of the lid member;
   placing the electronic element in a bottom part of the recessed part;
   placing the lid member on the base substrate so that the sealing part and the brazing filler metal layer overlap; and
   joining the lid member to the sealing part by application of an energy beam to create a region without the brazing filler metal layer.

* * * * *